United States Patent [19]
Flaherty

[11] Patent Number: 5,340,767
[45] Date of Patent: Aug. 23, 1994

[54] METHOD OF FORMING AND SELECTIVELY COUPLING A PLURALITY OF MODULES ON AN INTEGRATED CIRCUIT CHIP

[75] Inventor: Ed Flaherty, Houston, Tex.

[73] Assignee: Texas Instruments Incorporated, Dallas, Tex.

[21] Appl. No.: 42,848

[22] Filed: Apr. 5, 1993

Related U.S. Application Data

[63] Continuation of Ser. No. 720,307, Jun. 25, 1991, abandoned.

[51] Int. Cl.⁵ .................... H01L 21/82; H01L 21/66
[52] U.S. Cl. ............................................. 437/54
[58] Field of Search ............................................. 437/8

[56] References Cited

U.S. PATENT DOCUMENTS

| | | | |
|---|---|---|---|
| 3,365,707 | 1/1968 | Mayhew | 365/154 |
| 3,553,830 | 1/1968 | Jenny et al. | 437/54 |
| 3,707,036 | 12/1972 | Okabe et al. | 437/54 |
| 3,866,311 | 2/1975 | Salles et al. | 437/190 |
| 4,586,242 | 5/1986 | Harrison | 437/8 |

Primary Examiner—Robert Kunemund
Assistant Examiner—David E. Graybill
Attorney, Agent, or Firm—Ira S. Matsil; James C. Kesterson; Richard L. Donaldson

[57] ABSTRACT

A method of forming an integrated circuit comprising forming a plurality of modules on a chip. In addition, a plurality of conductive bond regions are formed adjacent the chip. Further, selected bond regions are coupled to selected modules such that a subset of the plurality of modules may be accessed by the selected bond regions.

17 Claims, 4 Drawing Sheets

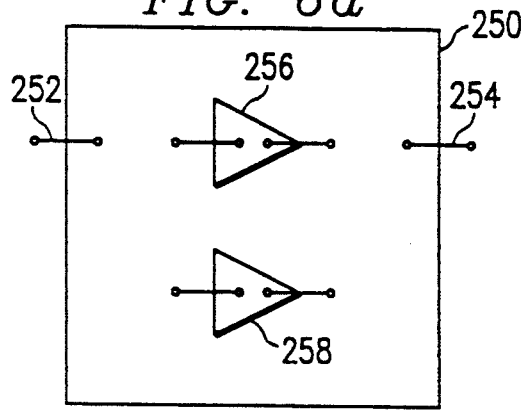
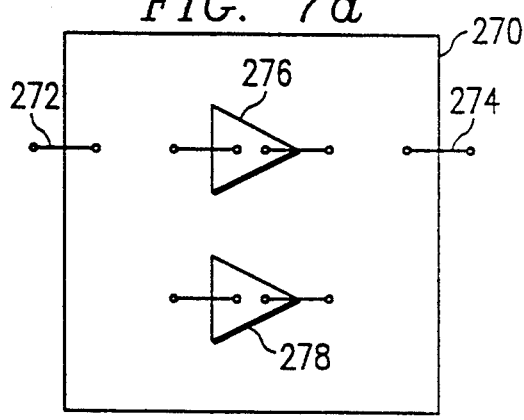
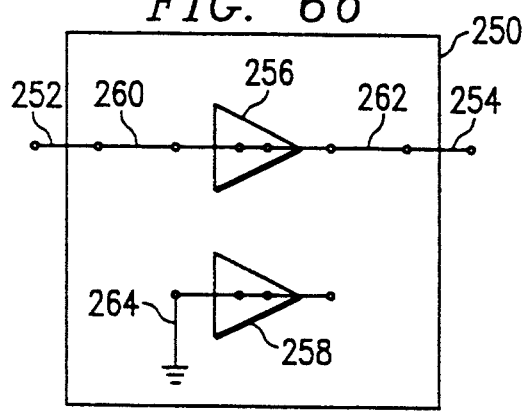
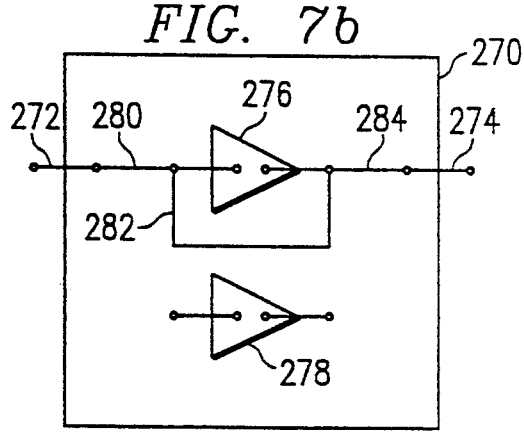
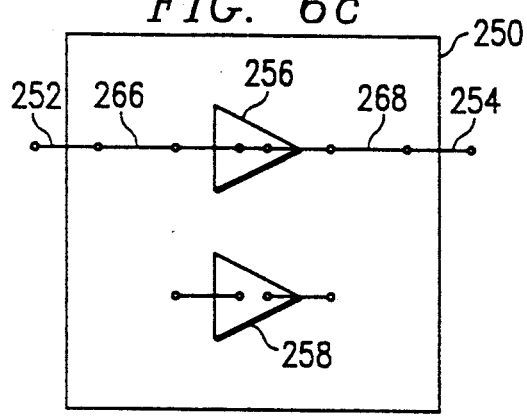
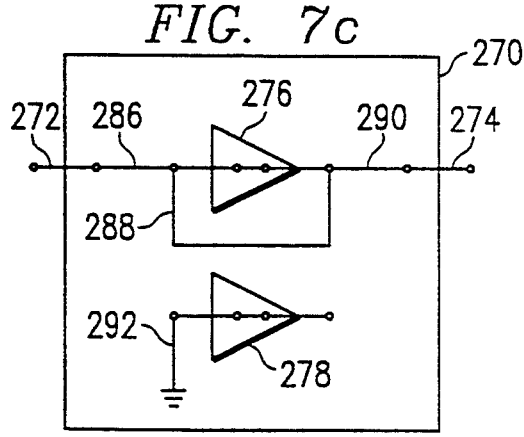

METHOD OF FORMING AND SELECTIVELY COUPLING A PLURALITY OF MODULES ON AN INTEGRATED CIRCUIT CHIP

This application is a continuation of application Ser. No. 07/720,307, filed Jun. 25, 1991, now abandoned.

TECHNICAL FIELD OF THE INVENTION

This invention relates to integrated circuits and, more particularly, to a microcontroller and the method of forming the microcontroller.

BACKGROUND OF THE INVENTION

As technology advances, it has become increasingly possible and economical to place various computer peripherals onto a single chip known as a microcontroller. These peripherals may include items such as serial ports, memories, central processing units, timers, parallel ports, etc. Thus, where a customer has a particular implementation in mind, the customer may seek a single chip microcontroller having various peripherals in order to perform a particular function or functions. It is common in the industry for such a customer to enlist the assistance of a designer/manufacturer in producing and customizing these microcontrollers.

The overall time frame involved in producing a finalized end product microcontroller commonly spans on the order of eighteen to twenty-four months. The process is typically broken down into two phases. In the first phase, a first version of the microcontroller having a field programmable memory is designed, constructed, and provided to the customer. The field programmable memory microcontroller typically takes six to twelve months to develop and deliver to the customer. The field programmable memory of the first phase microcontroller permits the customer to modify the program code within the memory in order to test, develop and debug that program code. Once the customer has finalized the program code, he returns that information to the manufacturer so that the end product microcontroller may be created in the second phase.

In the second phase, the manufacturer takes the information provided from the customer and redesigns an entirely new end product microcontroller. The end product microcontroller includes a permanent memory such as a read-only memory (ROM) for holding the program code previously tested, developed and debugged by the customer. Because the permanent memory is commonly different in physical size than the field programmable memory of the first phase device, the creation of the end product device entails all the steps previously required during the first phase development. As a result, the process of phase one is duplicated in phase two and another nine to twelve months are required before the end product can be delivered to the customer. Thus, it may be appreciated that under the current system for customizing microcontrollers, a customer may wait on the order of two years prior to being able to put his ultimate microcontroller into use in the marketplace. Therefore, a need has arisen for a methodology and resulting apparatus which provide a more efficient process, and a reduced production time for creating and customizing a microcontroller which may be sold in the marketplace.

SUMMARY OF THE INVENTION

In accordance with the present invention, a novel structure and methodology for creating a microcontroller are provided which may substantially eliminate or reduce disadvantages and problems associated with prior processes and apparatus involved in the construction of microcontrollers.

The present invention includes a method of forming an integrated circuit comprising forming a plurality of modules on a chip. In addition, a plurality of conductive bond regions are formed adjacent the chip. Further, selected bond regions are coupled to selected modules such that a subset of the plurality of modules may be accessed by the selected bond regions.

The various processes and embodiments of the present invention provide numerous technical advantages over the prior art. One technical advantage is that development efforts are significantly reduced, thereby reducing both delivery times and the costs associated with long development programs. Another technical advantage is the ability to automate the completion process for finalizing the microcontroller structure so that reduced manpower is needed. Still another technical advantage is that a semiconductor chip having a given number of bond pads may be bonded into various different packages wherein each package has a different number of pins. Yet another technical advantage is that a chip may be customized in very few steps, and those steps occur very late in the manufacturing process flow. Thus, in accordance with the present invention, a device may be constructed to an almost-complete stage, and then few steps are necessary to complete the device into a finalized and customized device with any number of pins and for any of various different chip packages.

BRIEF DESCRIPTION OF THE DRAWINGS

For a more complete understanding of the embodiments of the present invention and the advantages thereof, reference is now made to the following description taken in conjunction with the accompanying drawings in which:

FIG. 6a illustrates a schematic of a pair of buffers which may be configured to provide either a low impedance, high impedance or no impedance format;

FIG. 6b illustrates a first embodiment of the buffers of FIG. 6a connected in order to form a high impedance format;

FIG. 6c illustrates a second embodiment of the buffers of FIG. 6a connected in order to form a high impedance format;

FIG. 7a illustrates a schematic of a pair of buffers which may be configured to provide either a low impedance, high impedance or no impedance format;

FIG. 7b illustrates a first embodiment of the buffers of FIG. 7a connected in a manner to provide a no impedance format; and FIG. 7c illustrates a second embodiment of the buffers of FIG. 7a connected in a manner to provide a no impedance format.

DETAILED DESCRIPTION OF THE INVENTION

Figure 1:
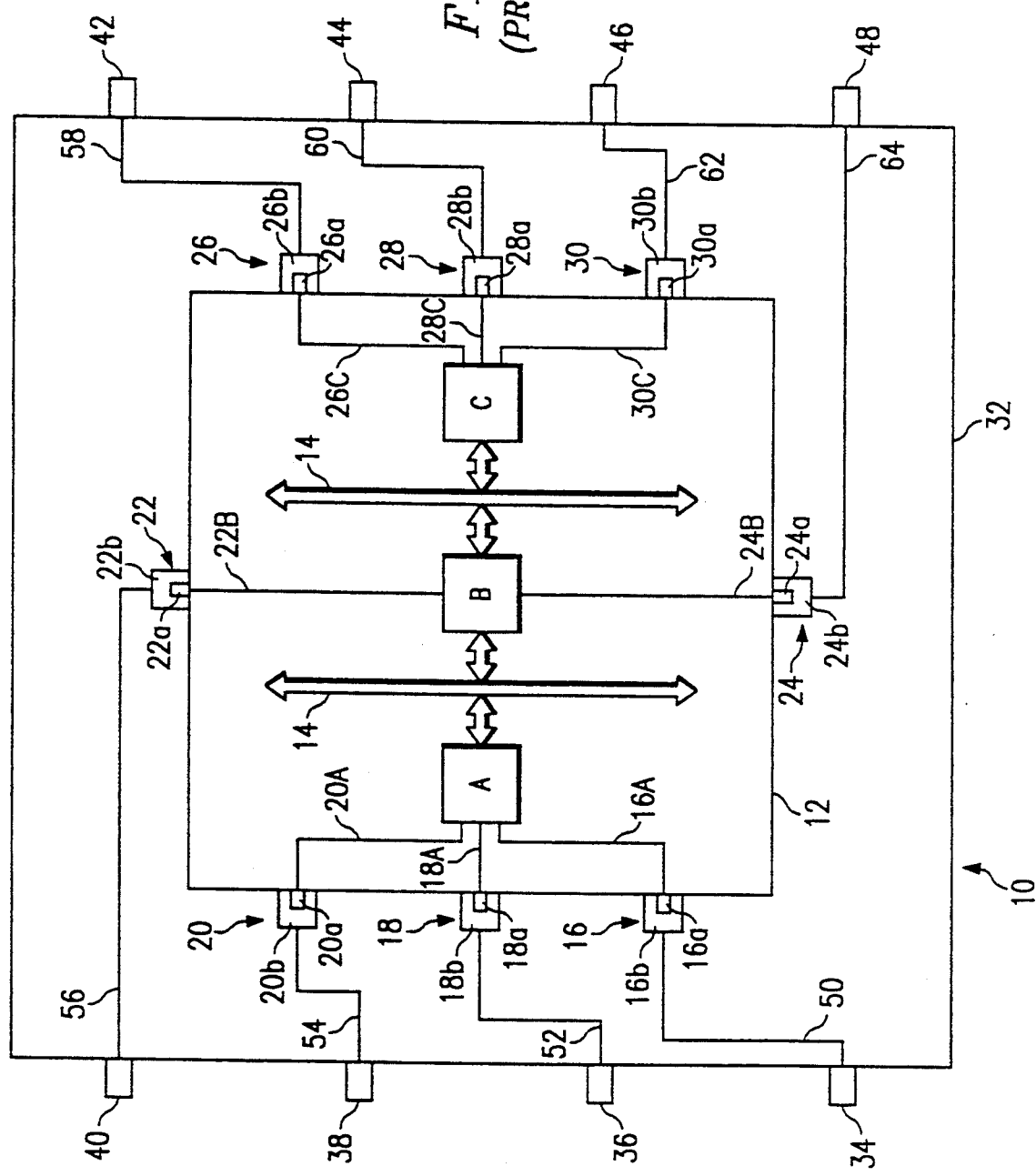
FIG. 1 illustrates a microcontroller having modules A, B and C thereon.

FIG. 1 illustrates a general layout view of a prior art microcontroller designated generally at 10. For purposes of definition, the term microcontroller is used herein in order to describe a single chip device which includes a plurality of modules which may be collected onto a single chip in order to perform various computer-related functions. In particular, chip 12 is shown for illustrative purposes as having three modules designated by capital letters A, B and C. Modules A, B and C may be chosen from any of various peripherals typically used with a microcontroller such as a central processing unit, any one of a number of types of memories such as random access memory (RAM), read-only memory (ROM), erasable programmable read-only memory (EPROM) or electrically-erasable programmable read-only memory (EEPROM), serial ports, parallel ports, timers, or various other peripherals known in the art. In some instances, a single microcontroller may have more than one module performing the same or a similar function. Thus, a single microcontroller may have multiple timers, multiple memories or other peripherals, where more than one module is required for similar purposes. For exemplary purposes, chip 12 is shown as only including three modules, but it should be understood that any number of modules may be required in order to perform a specified set of functions.

Chip 12 further includes an internal bus or busses 14 so that modules A, B and C may interact with one another. Internal buses 14 are shown for illustrative purposes as being connected to all of the modules on chip 12, but it should be understood that certain modules may be connected directly with one another without the necessity for a bus, or still further, that certain modules may be connected in a manner where no access to a bus is provided. Modules A, B and C are further connected to respective evenly-numbered bond structures 16–30. In particular, module A is connected to bond structures 16, 18 and 20, module B is connected to bond structures 22 and 24, and module C is connected to bond structures 26, 28 and 30. Each module is connected to a bond structure via a connecting conductor designated in a manner corresponding to the number and letter of the module and bond structure, respectively. For example, module A is connected to bond structure 16 by a connecting conductor designated as 16A. Similarly, module B is connected to bond structure 24 by a connecting conductor designated 24B, and so forth. Bond structures 16–30 permit access to various signals and/or controls to and from the respective modules to which the bond structures are connected.

Each bond structure 16–30 includes both a bond buffer and a bond pad. For purposes of illustration, each bond buffer is shown as a smaller square placed within the outer square illustrating a respective bond pad. Thus, bond structure 16 is shown to include a bond buffer 16a disposed within a bond pad 16b. The use of concentric squares in FIG. 1 is solely for purposes of illustration, and it should be understood that in a semiconductor device it is quite common for bond buffer 16a and bond pad 16b to be incorporated into a single monolithic bond structure 16. Each bond pad provides a conductive element in order to make electrical contact to the bond structure. Each bond buffer provides an apparatus for buffering the signal either to or from the corresponding bond structure. In particular, a bond buffer is commonly configured in a manner to provide either a low impedance, a high impedance or a no impedance buffering format. The particular choice of buffering format depends on the type of signal connected to or received from the bond structure. For example, a low impedance bond pad may be used for a bus expansion port while a high impedance bond pad may be used for a serial port. A no impedance bond pad is commonly used for a direct connection such as is commonly desired for a power supply connection.

Modules A, B and C typically require a variable number, such as two or three, bond structures per module in order to access the functions of the respective modules. However, it should be understood that any number of bond structures may be required per module and, in some instances, a module may require any number of bond structures in order to fully access the entire functionality of the particular module. For purposes of illustration in FIG. 1, modules A and C are shown to require three bond structures while module B is shown to require two bond structures.

Microcontroller 10 further includes a package 32 upon which chip 12 is mounted. Package 32 further includes a series of electrical pins evenly numbered 34–48 Pins 34–48 are connected, or "bonded", to respective bond structures via bond wires evenly numbered 50–64. As a result, pins 34–48 provide electrical access to and/or from the respective bond structures to which each pin is connected. Still further, since the bond structures provide electrical access to modules A, B and C, it may be appreciated that each pin 34–48 ultimately provides electrical access to a module A, B or C within chip 12.

Under current technology, a customer such as a computer board manufacturer commonly enlists the aid of a microcontroller designer/manufacturer. This customer typically incurs a two-phase process in creating, developing, and ultimately marketing a microcontroller. During the first phase, the customer commonly approaches a design and manufacturing company with a series of specified functions which the customer would like the microcontroller to perform. The customer may also provide a particular pin-out scheme for the packaging of the chip. From this information, the designer/manufacturer will commonly proceed by designing and developing a field programmable version of the ultimate microcontroller.

The field programmable microcontroller commonly requires anywhere from nine to twelve months to be designed and reduced to an operating microcontroller. This design process requires various steps such as schematic formation and chip development which may take up to six months. Thereafter, an additional three months of fabrication and one month of testing is often required. The resultant field programmable device will have a number of modules on it, such as microcontroller 10 of FIG. 1. At least one of the modules will be a programmable memory such as an EPROM or EEPROM. The programmable memory allows the customer to utilize the field programmable microcontroller in a manner such that the code in the memory may be altered during the customer's testing process. As a result, the customer may debug or revise the code until that code is in its finalized form. Once this finalized code is established, the customer typically provides that code to the designer/manufacturer so that the designer/manufacturer may produce an end product microcontroller having a permanent memory with that code encoded therein.

The second phase of development encompasses the processes necessary to develop the debugged code microcontroller into a permanent memory microcontroller. This process also typically entails another six months of development and layout, three months of fabrication and one month of testing. As a result, another nine months to one year is spent before the customer receives its final end product. Thus, it may be appreciated that the complete life cycle for both phases may easily consume anywhere from eighteen to twenty-four months from the time the customer sets forth its initial parameters to the time a final product is provided to the marketplace. This potential two-year expenditure of time brings with it a corresponding expenditure of money from the cost of development and the loss or lack of revenues during the development time period. As a result, there is a great need to provide a method and apparatus which substantially reduce this time and money expenditure. The embodiments and methodologies discussed herein provide such a reduction and, therefore, permit a microcontroller customer to develop a custom microcontroller in a much shorter length of time, thereby expediting the bringing of that microcontroller to the marketplace.

The preferred embodiments of the present invention are illustrated in FIGS. 2–7c of the drawings, like numerals being used to refer to like and corresponding parts of the various drawings.

Figure 2:
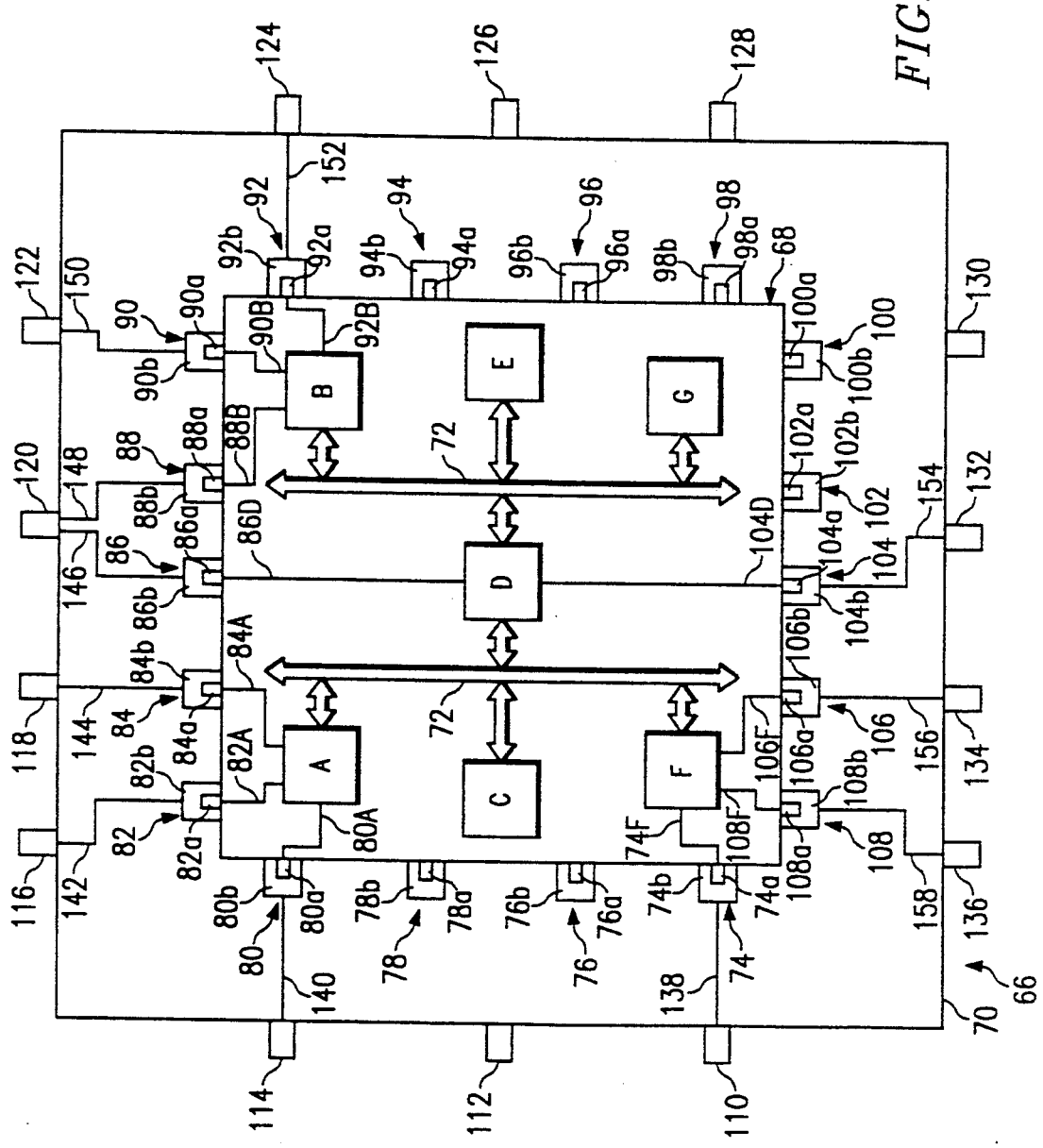
FIG. 2 illustrates a microcontroller having modules A–G thereon.

FIG. 2 illustrates a general view of a preferred embodiment microcontroller designated at 66. Microcontroller 66 is similar in certain respects to microcontroller 10 discussed in FIG. 1. Microcontroller 66 includes a chip 68 and a package 70. Chip 68 includes seven different modules designated by capital letters A–G. Each microcontroller module may comprise any of various peripherals such as a central processing unit, various memories, a serial interface, a serial peripheral interface, a serial communication interface, timers, parallel I/O or an A-D converter. Further, modules A–G have access to, and may communicate over, internal buses 72. The collection of modules A–G are selected and established as a superset of modules. In other words, modules A–G represent a group of modules which are capable of performing a large number of microcontroller functions and, hence, a subset of the modules may be utilized in order to implement a particular function or functions desired by a customer. Thus, modules A–G are capable of accommodating various different potential customer needs and, as a result, a subset of the modules may be accessed in order to satisfy the needs of any one of those customers.

For example, microcontroller 66 of FIG. 2 includes modules A–G, but is particularly configured in such a way so as to satisfy a customer who desires the functions of only modules A, B, D and F. Thus, the embodiment of FIG. 2 establishes one highly novel and advantageous aspect in that a plurality of modules are designed and disposed in chip 68 so that once a customer specifies his needs, a subset of those modules may be configured by the designer/manufacturer in a manner to provide the functions specified by the customer. One highly advantageous aspect of this embodiment is that the designer/manufacturer can quickly configure a subset of modules and meet the customer's needs without having to first design, develop and fabricate a chip having only those particular modules as is the case for microcontroller 10 discussed in connection with FIG. 1.

Chip 68 includes a plurality of bond structures evenly numbered 7–108 disposed around the general perimeter of chip 68. It should be noted that the bond structures are actually constructed on the surface of chip 68, but are shown protruding outward for purposes of illustration. The number of bond structures is established such that each module A–G may be fully accessed by the maximum number of bond structures required for the particular module. Thus, as stated above, a given module within a microcontroller typically requires on the order of two to three bond structures. Further, for exemplary purposes, the seven modules of chip 68 are considered to require a total of eighteen bond structures if each of the modules were ultimately used. As a result, eighteen bond structures 7–108 are provided around the outer periphery of chip 68. Consequently, if a customer sought to utilize the functions of all modules A–G, the required number of bond structures would be available to connect thereto. In the illustration of FIG. 2, however, it is presupposed that the customer has desired a microcontroller which performs only the functions of modules A, B, D and F. Accordingly, only those modules are connected to corresponding bond structures. The remaining unneeded bond structures are simply not connected to modules.

The module-to-bond structure connections are illustrated through connecting conductors labeled in accordance with the reference numeral of the corresponding bond structure and the reference letter of the corresponding module. For example, connecting conductor 74F is the conductor which connects bond structure 74 to module F. The remaining connecting conductors in FIG. 2 are also labeled in this manner. Connecting conductors 74F through 108F may be formed in a single processing step. For example, under known semiconductor process concepts, connecting conductors 74F through 108F may be formed in a single metal layer. Thus, if a previous metal layer were used for initial processing, a single metal-two layer could be used to simultaneously form connecting conductors 74F through 108F.

Bond structures 7–108, like bond structures 16–30 shown in FIG. 1, each are diagrammatically shown as including a bond buffer illustrated as a smaller square within a bond pad illustrated as a larger square. Again, as is commonly known in the art, the bond buffer and corresponding bond pad are typically manufactured as a monolithic structure. Each bond buffer is designated by the reference numeral corresponding to its respective bond structure and the letter "a". Thus, for example, bond buffer 74a represents the bond buffer associated with bond structure 74. Likewise, bond buffers 76a–108a represent the bond buffers for bond structures 76–108, respectively. Similarly, each bond pad is referenced in accordance with its respective bond structure and the letter "b". Thus, the bond pad associated with bond structure 74 is identified as bond pad 74b. Likewise, bond pads 76b–108b are associated with bond structures 76–108, respectively.

Microcontroller 66 further includes a plurality of pins evenly numbered 110–136, and preferably disposed around the outer periphery of package 70. Certain selected pins from this plurality of pins 110–136 are connected to various bond structures around chip 68. These connections are made via bond wires which are designated by even numbers 138–158. In the preferred embodiment, the connection between a pin and a bond structure is accomplished between relatively proximate pins and bond structures. For example, it is preferable to connect bond structure 80 to either pin 112, 114 or 116, because those pins are proximate bond structure 80. This format of connections minimizes problems associated with lengthy connecting conductors, and also prevents the possibility of overlapping connecting conductors. In an alternative embodiment discussed below, however, a method and structure are disclosed for connecting a bond structure to a pin which is relatively removed from that bond structure.

It should be appreciated that only selected pins are connected to respective selected bond structures. Further, in some instances, a particular pin may be connected to more than one bond structure. Thus, for example, pin 120 is connected to bond structures 86 and 88 via bond wires 146 and 148, respectively. As a result, electrical contact made to pin 120 will provide contact to bond structures 86 and 88, and modules D and B, respectively. It should be understood, however, that this dual or multi-connection is only necessary where a single pin is specified as requiring access to more than one module. Thus, any pin may be connected to a single corresponding bond structure or a plurality of bond structures.

Again, the example shown in FIG. 2 is configured as such for a customer who desires the functions performed only by modules A, B, D and F. Thus, while modules C, D, E and G remain on the microcontroller, their functionality is not required. Thus, these unneeded modules are not connected to the remaining bond structures which otherwise exist for the instance where the function of those modules would be needed. As an alternative example, the embodiment illustrated in FIG. 2 could be configured such that any subset of modules A–G could be connected to representative bond structures, which likewise could be connected to corresponding pins.

From the above, and from the overall illustration of FIG. 2, it may be appreciated that the embodiment shown therein provides for a plurality of modules, each of which is operable to perform various microcontroller functions. This plurality of modules defines a superset of modules such that any subset of modules may be selected in order to provide the functions necessary or specified by a customer. As a result, the nine to twelve month process described as phase one above may be significantly reduced. This reduction occurs because the designer/manufacturer may develop a microcontroller similar to that shown in FIG. 2 without connecting any modules to corresponding bond structures. This development may occur without first receiving any specific needs or input from a customer. Thus, the time to develop and produce the superset microcontroller is removed from the first phase discussed above. As a result, the designer/manufacturer can produce a superset microcontroller and then await a customer who has specific microcontroller needs. Once the designer/manufacturer receives these needs, it may proceed very quickly by selecting the modules or the superset controller and configuring them to serve the customer's purpose. Consequently, the customer must only wait for this brief customization process rather than the full design and development time period discussed as the first phase, above. Naturally, this time-savings propagates through the entire development process and ultimately the customer can debug and reduce the microcontroller to its final form in a reduced amount of time and at a reduced amount of costs.

Once a customer provides his desired functionality to the designer/manufacturer, the designer/manufacturer may choose specific modules from the superset of modules to accommodate the needs of the customer. The particular implementation of the selected modules is preferably carried forth in a two-step manner. First, those modules which are necessary to perform the stated functions have internal connections made so that each module is capable of performing its function. Second, the chosen modules are connected to various bond structures which are, in turn, connected to pins so that the function of the particular modules may be realized through those pins. These two steps may be automated so that the designer can select the desirable modules, and software may implement the necessary embodiments and methodologies for finalizing the microcontroller. The particular embodiments and methodologies for performing these two steps is discussed in greater detail below.

Figure 3:
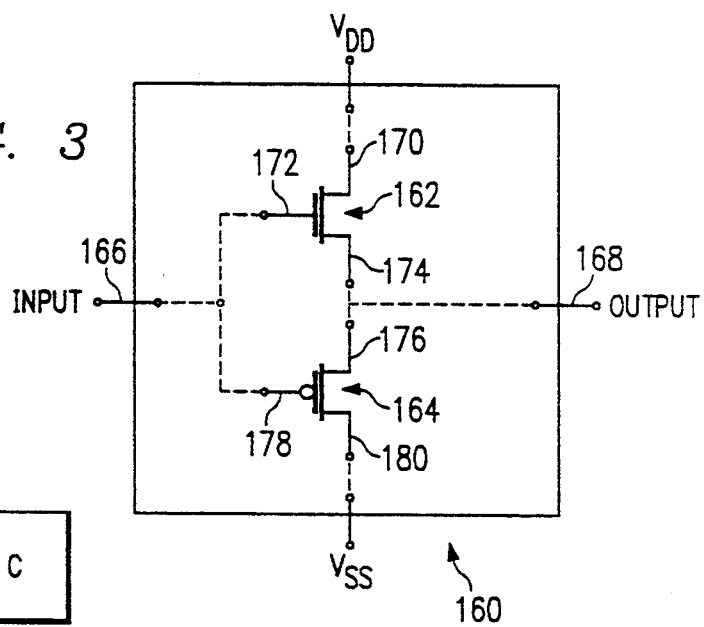
FIG. 3 illustrates a schematic of components configured such that they may or may not be internally interconnected.

FIG. 3 illustrates a simplified schematic view of a potential module embodiment. In particular, FIG. 3 illustrates a module 160 having an n channel transistor 162 and a p channel transistor 164. Module 160 further includes an input 166 and an output 168. Module 160 may further be connected to power supply pins $V_{DD}$ and $V_{SS}$.

n channel transistor 162 includes a drain 170, a gate 172 and a source 174. Similarly, p channel transistor 164 includes a source 176, a gate 178 and a drain 180. The dotted lines illustrated within module 160 show potential internal interconnections or contacts which, if made, would form an inverter circuit function connected between input 166 and output 168, and powered by supply pins $V_{DD}$ and $V_{SS}$. The embodiment of FIG. 3 therefore illustrates a module 160, having components parts (transistors in this embodiment) which have not yet been interconnected. Thus, FIG. 3 serves as an illustration of how the various components within modules A–G of FIG. 2 may be constructed up to a given point and then warehoused or maintained until a customer comes forth with his given specifications.

Once a customer has provided the designer/manufacturer with his specifications, the designer may choose which modules are necessary to implement those specifications. In the example of FIG. 3, if the designer were to decide that module 160 were necessary to perform the functions stated by the customer, an additional processing step may be employed in order to internally connect transistors 162 and 164 in a manner as illustrated by the dotted lines. These internal connections are made in accordance with the applicable construction process. For example, the internal components may only need internal contacts in order to be interconnected. In that example, those contacts are made when it is desired to utilize the particular module. Other internal interconnection schemes such as formation or processing of semiconductor regions may be implemented with the present embodiment. Indeed, it should be understood that the present embodiment is not limited to internal connections performed by completing contacts. The example of completing internal contacts, however, is desirable because this step is very late in the manufacturing process flow.

If the designer/manufacturer were to decide that module 160 were not necessary to the overall functionality required, a process, such as a semiconductor masking process which is well-known in the art, could be implemented in order to prevent or inhibit the internal interconnections within the module from being made. In that instance, transistors 162 and 164 would exist with no interconnections and, thus, would electrically float, thereby posing no load on the power supplies or any input or output.

From the above, it may be appreciated that the example of FIG. 3 illustrates that the modules of FIG. 2 may be constructed such that various components are formed therein, but are not interconnected until a decision is made as to whether the functions of those modules are needed. While the example of FIG. 3 teaches only a pair of transistors which may be connected to perform an inverting function, it should be understood that this is merely a single embodiment and that a multitude of transistor or other device configurations could be employed within a single module. Once those various components are so employed, the internal interconnection(s) may be made within that module or, alternatively, the internal interconnection(s) may be inhibited such that those interconnections are not made and that the associated componentry is not subsequently utilized.

Figure 4:
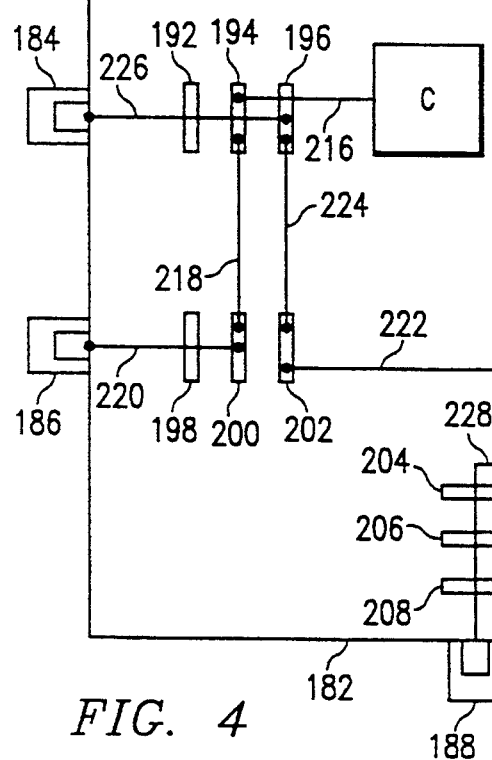
FIG. 4 illustrates a partial diagram of an interconnection scheme using buried conductive regions between chip bond pads and modules.

In addition to making or inhibiting the various interconnections within modules A-G, the designer/manufacturer must further connect the desired modules to the required number of bond structures. FIG. 4 illustrates a particular methodology and embodiment for accomplishing these connections. In particular, FIG. 4 illustrates a partial view of a chip 182 including two modules denoted C and F. Four bond structures, evenly numbered 184-190, are disposed around the outer periphery of chip 182. As discussed above, it is common for a designer to establish a layout of modules such that each module is immediately proximate the bond structures to which it will be attached. By performing a layout in this manner, the designer ensures that no connecting conductors for different modules will have to cross or intersect one another. The embodiment of FIG. 4, however, includes a structure for effectively crossing connecting conductors without electrically short circuiting or intersecting those bond wires with one another.

Bond structures 184-190 each have a series of respective buried conductive regions, evenly numbered 192-214, formed proximate the respective bond structures. While the embodiment of FIG. 4 illustrates three buried conductive regions per bond structure, it should be understood that any number of buried conductive regions may be similarly used. Buried conductive regions 192-214 are conductive materials which are disposed below the surface of chip 182. Buried conductive regions 192-214 are preferably formed as either metallic or highly doped semiconductor regions according to principles and methodologies known in the art. Further, buried conductive regions 192-214 are preferably pre-placed in their respective positions during a metal-1 level as part of the base line manufacturing process flow.

Module C is connected to bond structure 186 via a series of three connecting conductors 216, 218 and 220. Module F is connected to bond structure 184 via a series of three connecting conductors 222, 224 and 226. Thus, buried conductive regions 192-214 permit connecting conductors to connect modules to bond structures where those wires effectively cross one another without immediately intersecting or contacting one another.

From the illustration of FIG. 4, it should be appreciated that if connecting conductors were used on the two-dimensional surface of chip 182, the configuration requiring module C to be connected to bond structure 186 and module F to be connected to bond structure 184 would require an intersection, or overlapping, of the respective connecting conductors going from each module to its respective bond structure. Buried conductive regions 192-202, however, provide an embodiment by which an electrical path may be formed in a three-dimensional manner in order to avoid the intersection of these two conductors.

The three-dimensional connections are accomplished as follows. Module C is connected to bond structure 186 via a first connecting conductor 216 which is coplanar with the two-dimensional surface of chip 182. Connecting conductor 216, however, communicates electrically with buried conductive region 194 via a contact which is preferably formed perpendicular to the plane defined by the surface of chip 182. Connecting conductor 218 provides an electrical connection between buried conductive region 194 and buried conductive region 200. Connecting conductor 218 is electrically connected to both buried conductive regions 194 and 200 via contacts formed vertically downward into the plane defined by the surface of chip 182. An additional connecting conductor 220 provides an electrical path between buried conductive region 200 and bond structure 186. Thus, it may be appreciated that an electrical path is created in a three-dimensional serpentine manner from module C to bond structure 186.

Module F is electrically connected to bond structure 184 in a manner similar to that of module C. In particular, connecting conductor 222 is connected to buried conductive region 202. Buried conductive region 202 is connected to connecting conductor 224 which is connected to buried conductor 196. In addition, buried conductor 196 is connected to connecting conductor 226 which connects to bond structure 184. It should be noted that each of the connecting conductors are preferably formed in a metal-2 layer, and during the late stages of the customization process.

From a review of the above, it may be appreciated that the use of buried conductive regions 192-202 permits modules C and F to be connected to bond structures 186 and 184, respectively, without a physical intersection of the electrical pathways making those connections. As a result, there is no requirement that a module be placed immediately proximate the bond structure to which it may ultimately be attached. Further, this feature permits the ultimate pin-out to be defined during the customization process without a concern of the specific location of each module with respect to bond structures and pins. Additionally, the use of buried conductive regions allows the designer to choose among the potential bond structures so that those which are actually implemented are evenly distributed around the chip. As a result, chip 182 can be efficiently placed into various different chip packages, where each package has a different number and/or configuration of pins. Thus, the plurality of modules shown in FIG. 2 may be configured in a manner which permits them to be connected to bond structures which are not immediately proximate each module, but instead are on alternative locations around chip 68. Thus, the embodiment of buried conductive regions provides additional flexibility in customizing the embodiment of FIG. 2 to meet the needs specified by the customer to the designer/manufacturer.

Module F is also connected to bond structures 188 and 190 via connecting conductors 228 and 230, respectively. These connections illustrate that a module may also be connected directly to a bond structure without contacting a buried conductive region.

Figure 5A:
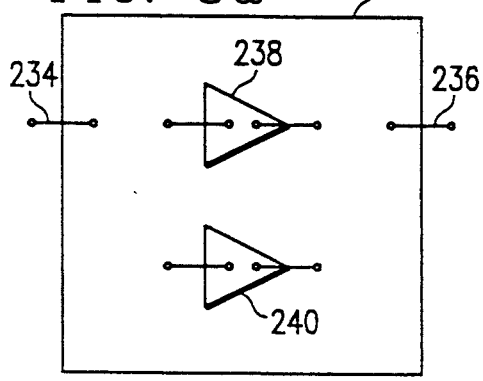
FIG. 5a illustrates a schematic of a pair of buffers which may be configured to provide either a low impedance strong, high impedance weak or no impedance format.
Figure 5B:
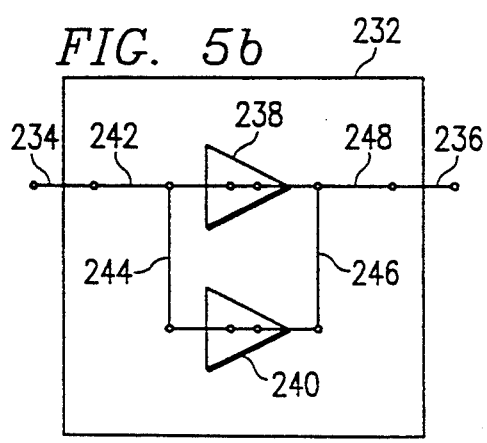
FIG. 5b illustrates a schematic of FIG. 5a connected in a low impedance format.

FIGS. 5a and 5b illustrate an additional embodiment providing yet another customization feature. This feature may also be implemented with the embodiment illustrated in FIG. 2. As stated above, the various signals provided by modules A-G to their corresponding bond structures may require one of three different types of bond buffers. In particular, a given module function may require a low impedance bond buffer, a high impedance bond buffer, or a no impedance bond buffer. These buffers may be either input or output configurations. FIGS. 5a-7c illustrate additional apparatus and methodologies which permit initial circuitry included within a bond buffer to be customized in order to accomplish any one of the three potentially necessary impedance formats.

FIGS. 5a and 5b illustrate an apparatus and methodology for configuring a bond buffer into a low impedance bond buffer. In particular, FIG. 5a shows a bond buffer 232 including an input 234, an output 236, a first buffer 238, and a second buffer 240. The open terminals shown within buffers 238 and 240 are shown in this manner to illustrate that buffers 238 and 240 may be fabricated with their inside componentry (e.g., transistors) in a non-connected format such as that discussed in connection with FIG. 3. Thereafter, if it is decided that a particular buffer is necessary to perform a function, those internal components may be interconnected, thereby forming an operable device for buffers 238 and 248. These internal connections may be made during the same step as forming the internal connections of the various modules A-G discussed above. On the contrary, if those components need not be interconnected, any internal interconnection step may be inhibited such as discussed in connection with FIG. 4.

FIG. 5b illustrates buffers 238 and 240 of FIG. 5a configured in a manner to provide a low impedance bond buffer. This configuration is preferably performed in a two-step manner. First, the internal interconnections of buffers 238 and 240 are completed by connecting the various circuitry or componentry therein. For illustrative purposes, buffers 238 and 240 are shown in FIG. 5b as having a solid connection therethrough, but this solid line is used solely to illustrate that the components within those buffers have been interconnected. Second, connecting conductors 242, 244, 246 and 248 are used to connect buffers 238 and 248 in a manner such that bond buffer 232 provides a low impedance. In particular, input 234 is connected to buffer 238 via connecting conductor 242 while output 236 is connected to buffer 238 via connecting conductor 248. Buffer 240 is connected in parallel to buffer 238 via connecting conductors 244 and 246. As a result of these connections, the impedances of buffers 238 and 240 are connected in parallel and, therefore, result in an impedance lower than that of either buffer 238 or 240. Connecting conductors 242-248 may be formed in a single semiconductor fabrication metal layer such as that discussed above with reference to connecting modules to individual bond structures. Thus, the same metal-two layer may concurrently connect particular modules to particular bond structures while also completing the connections for configuring the individual bond buffers to a low impedance format.

FIG. 6a illustrates a bond buffer 250 including an input 252 and an output 254 as well as a first buffer 256 and a second buffer 258. A comparison of FIGS. 6a and 5a reveals that bond buffer 250 is the same initial structure as that of bond buffer 232. FIGS. 6b and 6c, however, illustrate that this same configuration may be configured to provide a high impedance format as opposed to the low impedance configuration shown in FIG. 5b.

FIG. 6b illustrates one embodiment of FIG. 6a configured in a high impedance format. The configuration of FIG. 6b is preferably transformed from FIG. 6a in a two-step process. First, the internal contacts within the componentry of buffers 256 and 258 are completed so that each buffer is operable to perform its buffering function. Like FIG. 5b, these internal contacts are illustrated in FIG. 6b as solid lines connecting the internal terminals of buffers 256 and 258. Second, connecting conductors 260, 262 and 264 are added, preferably in a single metal-two layer, in order to complete the a high impedance configuration for bond buffer 250. In particular, input 252 is connected to the input of buffer 256 via connecting conductor 260 while output 254 is connected to the output of buffer 256 via connecting conductor 262. Due to the connections to buffer 256, it may be appreciated that bond buffer 250 provides a single buffer impedance (i.e., a high impedance) format. Additionally, connecting conductor 264 is used to ground the input of buffer 258. This grounded input is preferable in order to prevent the connected componentry within buffer 258 from disturbing any signals or from drawing any power which may adversely affect any related or associated circuitry.

FIG. 6c illustrates an alternative methodology and embodiment by which bond buffer 250 of FIG. 6a may be configured in order to provide a high impedance format. The configuration of bond buffer 250 shown in FIG. 6c resulting from that shown in FIG. 6a is again preferably formed by a two-step process. First, a process is used to complete the interconnections within the componentry of buffer 256. It should be noted, however, that buffer 258 is appropriately masked so that the interconnections for the componentry within buffer 258 are not made. As a result, buffer 256 is operable to perform its buffering function while buffer 258 will have disconnected componentry therein. Second, connecting conductors 266 and 268 are formed in order to complete the connection of buffer 256 between input 252 and 254. Again, the resulting bond buffer 250 of FIG. 6c will provide a high impedance format.

FIG. 7a illustrates a bond buffer 270 including a first buffer 272 and a second buffer 274. Again, bond buffer 270 of FIG. 7a is initially the same configuration as that of bond buffer 232 of FIG. 5a and bond buffer 250 of FIG. 6a. FIGS. 7b and 7c, however, illustrate alternative configurations of FIG. 7a where bond buffer 270 is configured in order to provide a no impedance format.

FIG. 7b illustrates bond buffer 270 of FIG. 7a configured to provide a no impedance format. The configuration process required to derive the configuration of FIG. 7b from FIG. 7a again is preferably performed in two steps. First, the internal contacts of buffer 276 and 278 are inhibited so that the interconnections are prevented from occurring within either buffer. Thus, neither buffer 276 nor buffer 278 provides an operational buffer between its input and output, but instead remains as a collection of internal componentry which generally is internally disconnected and provides no buffering function. Second, connecting conductors 280, 228 and 284 are formed in order to provide a current path directly from inputs 272 to output 274. In particular, connecting conductor 280 connects input 272 to the input of buffer of 276. Connecting conductor 282 connects the input of buffer 276 to the output of buffer 276. Connecting conductor 284 connects the output of buffer 276 to output 274. Thus, it may be appreciated that a current path is formed directly between input 272 and output 274, thereby resulting in a no impedance path for bond buffer 270 of FIG. 7b.

FIG. 7c illustrates an alternative embodiment of bond buffer 270 configured from that shown in FIG. 7a in order to provide a no impedance format. The configuration process used to transform the buffer shown in FIG. 7a to the configuration shown in FIG. 7c is preferably performed in a two-step process. First, the internal interconnections are made to both buffers 276 and 278 such that each buffer is fully operational to provide its buffering function. Second, connecting conductors 286, 288, 290 and 292 are formed so that bond buffer 270 of FIG. 7c provides a no impedance format. In particular, connecting conductor 286 connects input 272 to the input of buffer 276. Connecting conductor 288 connects the input of buffer 276 to the output of buffer 276. Connecting conductor 290 connects the output of buffer 276 to output 274 of bond buffer 270. Thus, it may be appreciated that connecting conductors 286, 288 and 290 provide a no impedance current path between input 272 and output 274. Additionally, it should be noted that connecting conductor 292 is formed to connect the input of buffer 278 to ground. Again, this connection is preferable in order to ground the connected devices within buffer 278 so that they will not load any power supply or related circuitry or provide any additional noise within the system.

Although the present invention has been described in detail, it should be understood that various changes, substitutions and alterations can be made hereto without departing from the spirit and scope of the invention as defined by the appended claims. For example, while direct connections have been illustrated in many of the FIGURES, it should be understood that these direct connections may be alternatively accomplished by coupling one point through other components or features before connecting it to a second point.

What is claimed is:

1. A method of forming an integrated circuit, comprising the steps of:

forming a plurality of modules on a chip;

forming a plurality of conductive bond regions adjacent the chip;

forming a first group of conductive regions adjacent a first one of said bond regions, said first group of conductive regions exclusive to a first one of said modules such that none of said plurality of modules except said first module are coupled directly to any of said first conductive regions;

forming a second group of conductive regions adjacent a second one of said bond regions, said second group of conductive regions exclusive to a second one of said modules such that none of said plurality of modules except said second module are coupled directly to any of said second said conductive regions;

electrically coupling said first one of said modules to a first conductive region in the first group conductive regions;

electrically coupling said second one of said modules to a first conductive region in the second group of conductive regions;

electrically coupling the first conductive region in the first group of conductive regions to a second conductive region in the second group of conductive regions;

electrically coupling the first conductive region in the second group of conductive regions to a second conductive region in the first group of conductive regions;

electrically coupling the second conductive region in the second group of conductive regions to the bond region adjacent the second group of conductive regions;

electrically coupling the second conductive region in the first group of conductive regions to the bond region adjacent the first group of conductive regions; and wherein none of said coupling pass over any other of said couplings.

2. A method of forming an integrated circuit, comprising the steps of:

forming a plurality of conductive bond regions adjacent a chip, wherein each of the plurality of conductive bond regions is formed by the steps comprising:

forming a bond pad;

forming a bond buffer having an input and an output, wherein said bond buffer comprises:

a first buffer comprising selectively electrically interconnectable components, said first buffer having a first impedance when said interconnectable components are interconnected; and a second buffer comprising selectively electrically interconnectable components, said second buffer having a second impedance when said interconnectable components are interconnected, wherein each of the first and second buffers includes an input and an output; and configuring said bond buffer by electrically coupling the input of at least one of said first and second buffers to the input of said bond buffer and electrically coupling the output of at least one of said first and second buffers to the output of said bond buffer such that said bond buffer has a selected impedance between its input and output.

3. The method of claim 2 wherein said step of configuring said bond buffer comprises the steps of:

electrically coupling the input of the bond buffer to the input of the first buffer;

electrically coupling the output of the first buffer to the output of the bond buffer; and electrically coupling the input of the first buffer to the output of the first buffer such that no impedance is formed between the input and output of the bond buffer.

4. The method of claim 3 wherein the interconnectable components of the first buffer and the second buffer are not electrically connected to one another.

5. The method of claim 2 and further comprising the step of interconnecting the interconnectable components of said first buffer such that said first buffer has a first impedance between the input and the output.

6. The method of claim 5 and further comprising the step of interconnecting the interconnectable components of said second buffer such that said second buffer has a second impedance between the input and the output.

7. The method of claim 6 wherein said selected impedance is substantially equal to said first impedance.

8. The method of claim 7 wherein said step of configuring said bond buffer comprises the steps of:
electrically coupling the input of the bond buffer to the input of the first buffer; and
electrically coupling the output of the first buffer to the output of the bond buffer.

9. The method of claim 8 and further comprising electrically coupling the input of the second buffer to a ground.

10. The method of claim 6 wherein said selected impedance is lower than both said first and second impedance.

11. The method of claim 10 wherein said step of configuring said bond buffer comprises the steps of:
electrically coupling the input of the first buffer to the input of the second buffer;
electrically coupling the output of the first buffer to the output of the second buffer;
electrically coupling the input of the bond buffer to the input of the first buffer; and
electrically coupling the output of the first buffer to the output of the bond buffer.

12. The method of claim 5 wherein said selected impedance is substantially equal to said first impedance.

13. The method of claim 12 wherein said step of configuring said bond buffer comprises the steps of:
electrically coupling the input of the bond buffer to the input of the first buffer; and
electrically coupling the output of the first buffer to the output of the bond buffer.

14. The method of claim 13 wherein the interconnectable components of the second buffer are not electrically connected to one another.

15. The method of claim 5 wherein said selected impedance is substantially equal to zero.

16. The method of claim 15 wherein said step of forming a bond buffer comprises the steps of:
electrically coupling the input of the bond buffer to the input of the first buffer;
electrically coupling the output of the first buffer to the output of the bond buffer; and
coupling the input of the first buffer to the output of the first buffer.

17. The method of claim 16 and further comprising electrically coupling the input of the second buffer to a ground.

* * * * *